United States Patent [19]

Schröder

[11] 4,243,944

[45] Jan. 6, 1981

[54] CIRCUIT FOR AUTOMATIC DYNAMIC COMPRESSION OR EXPANSION

[75] Inventor: Ernst Schröder, Hanover, Fed. Rep. of Germany

[73] Assignee: Licentia Patent-Verwaltungs-G.m.b.H., Frankfurt am Main, Fed. Rep. of Germany

[21] Appl. No.: 944,841

[22] Filed: Sep. 22, 1978

[30] Foreign Application Priority Data

Sep. 27, 1977 [DE]   Fed. Rep. of Germany ........ 2743279

[51] Int. Cl.³ .............................................. H03G 7/00
[52] U.S. Cl. .................... 330/135; 330/136; 333/14
[58] Field of Search ............... 330/129, 135, 136, 279, 330/282, 284; 333/14

[56] References Cited

U.S. PATENT DOCUMENTS

| 3,969,680 | 7/1976 | Wermuth ........................... 333/14 X |
| 4,035,739 | 7/1977 | Dickopp et al. ...................... 330/129 |
| 4,103,239 | 7/1978 | Meewezen ......................... 333/14 X |

*Primary Examiner*—James B. Mullins
*Attorney, Agent, or Firm*—Spencer & Kaye

[57] ABSTRACT

The invention relates to a compander system. In such a compander system an adjusting member in the useful signal path is controlled by a control voltage which is generated in a branch path connected to the useful signal path and including at least one further adjusting member. The control voltage serves at the same time to control the adjusting members in the branch path in a counter-regulating sense. According to the present invention the branch path is connected to the input of the useful signal path during compression and to the output of the useful signal path during expansion.

7 Claims, 4 Drawing Figures

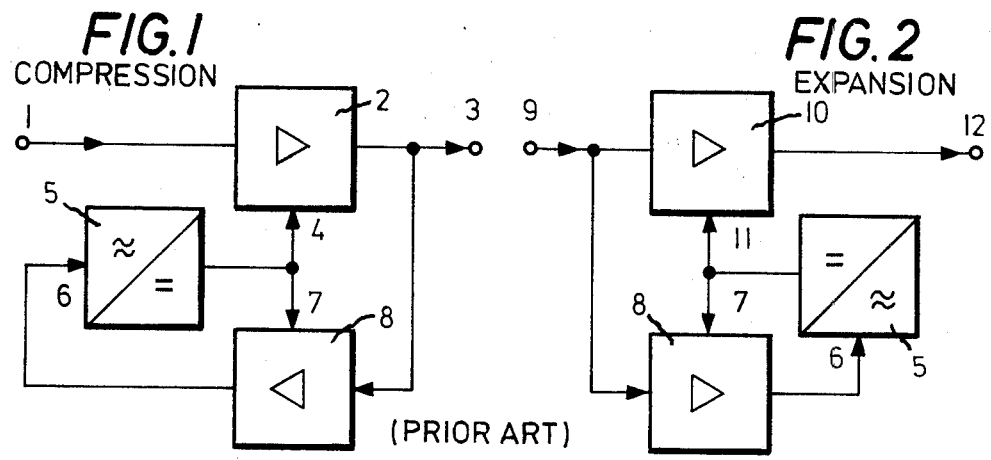
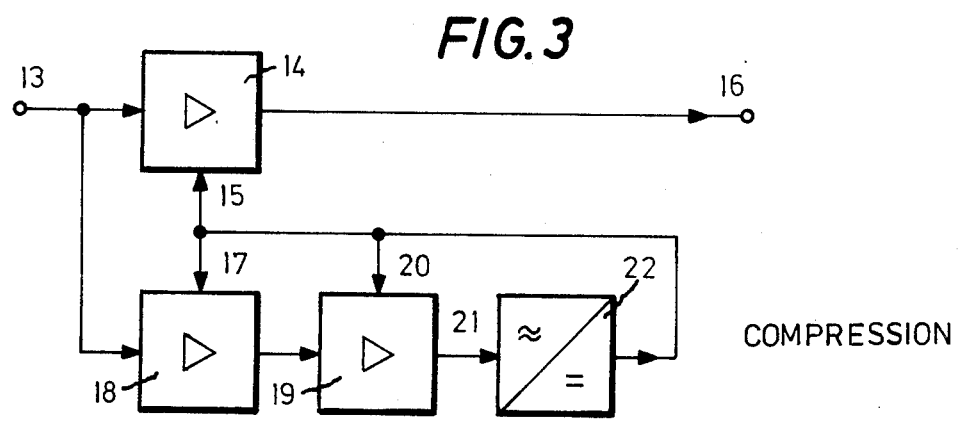
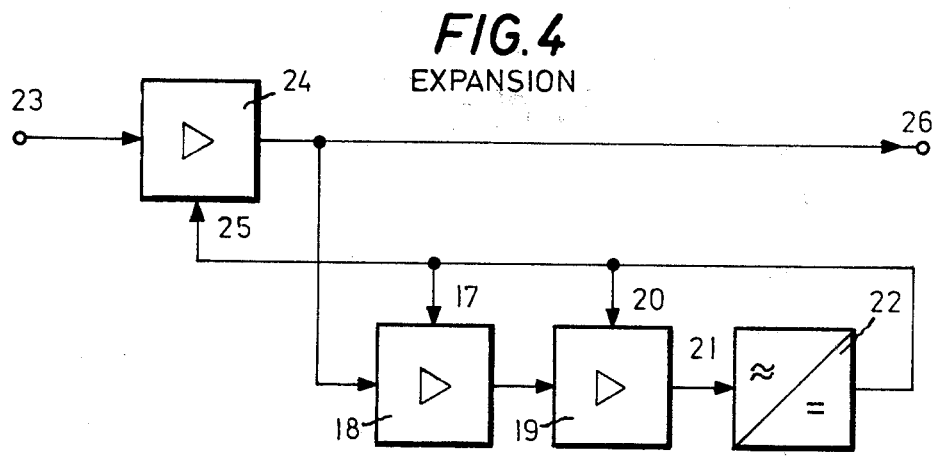

CIRCUIT FOR AUTOMATIC DYNAMIC COMPRESSION OR EXPANSION

BACKGROUND OF THE INVENTION

It is known to improve the quality of reproduction of audio frequency performances by increasing the signal spacing by a compression-expansion system (so-called compander system). The useful signals are compressed in amplitude in advance of the troublesome transmission path (e.g. lead or sound tape) and expanded after the transmission or storage.

With such systems there exists the difficulty inter alia of meeting the following requirements as far as possible: low ecomonic expense, characteristics that correspond to one another in compression and expansion, good reproduction of the required values in the apparatus e.g. a manufacturing series, and improvement of the system concept as regards choice of the degree of the expansion and compression. Known compander systems either require a relatively high expenditure for good quality or they do not meet the above-mentioned requirements to a sufficient extent with low expenditure, particular in the case of consumer apparatus.

These requirements are solved in the compander system according to U.S. Pat. No. 3,969,680. In that system the control voltage is also applied to means, located in the branch path, for varying the propagation constant in the sense of counter-regulation of the propagation constant in the branch path.

In the practical forms of the compander system according to U.S. Pat. No. 3,969,680 illustrated in the drawing of the mentioned specification the branch path provided for the generation of the control voltage is connected to the output of the useful signal path during compression and to the input of the useful signal path during expansion. This means that the compander system described is not immediately suitable for such a distribution of the compander components that the adjusting member in the useful signal path is located as close as possible to the transmission path or to the recording apparatus for the compressed signal. The adjusting member in the useful signal path, controlled e.g. by a direct control voltage, may then, without special difficulties, be controlled even with a long distance between this adjusting member of the useful signal path on the one hand and the branch path on the other hand. At the same time however there are necessary a lead feeding the useful signal to the output of the compression circuit and a lead from the input of the expansion circuit to the associated branch path.

SUMMARY OF THE INVENTION

An object of the invention is to improve the compander system described so that this compander system can be used even with the described distribution of the compander components, without a signal lead for the useful signal from the output of the compression circuit or from the input of the expansion circuit to the associated branch path being necessary.

According to the invention in the case of compression the branch path is connected to the input of the useful signal path and in the case of expansion the branch path is connected to the output of the useful signal path.

The invention has the advantage that the adjusting member located in the useful signal path may include in particular dynamically acting limiting means which upon a sudden increase of the useful signal limits this increase to a predetermined value. Since the input of the branch path is connected during compression not to the output but to the input of the useful signal path, this means that the full variation of the useful signal is utilized for the generation of a correspondingly high control voltage at the same time however the full variation of the useful signal is not effective at the output of the circuit.

BREIF DESCRIPTION OF THE DRAWINGS

The invention will be explained in more detail with reference to a practical example which is illustrated in the drawing.

FIG. 1 shows a compression circuit known from U.S. Pat. No. 3,969,680;

FIG. 2 shows an expansion circuit known from U.S. Pat. No. 3,969,680;

FIG. 3 shows a circuit according to the invention for compression; and

FIG. 4 shows a circuit according to the invention for expansion.

DESCRIPTION OF THE PREFERRED EMBODIMENTS

FIG. 1 shows the block circuit diagram of a circuit for the compression e.g. of LF signals which are fed to an input terminal 1. Correspondingly, the compressed useful signal can be taken off at an output terminal 3. The useful signal that can be taken off at the output terminal 3 has a smaller dynamic range than the useful signal fed to the input terminal 1. Such a circuit may be used e.g. in the playing of an audio tape apparatus.

For the purpose described, there is arranged in the useful signal path between the terminals 1 and 3 an amplifier 2 which is controllable in its amplification. The amplifier 2 has a control input 4 via which its amplification is controlled by means of a direct control voltage for the purpose of varying the propagation constant in the useful signal path.

For obtaining the said direct control voltage there is provided a branch path which includes a further amplifier 8 the amplification of which is controllable, and a control voltage generator 5 fed from the amplifier 8. The input of the branch path is connected to the output of the useful signal path (output of the amplifier 2). The control voltage generator 5 is so concentrated that it generates at its output a direct control voltage which advantageously depends on the alternating input voltage applied to the control voltage generator 5 in such manner that upon a predetermined threshold value being exceeded by the said alternating input voltage the direct control voltage at the output of the control voltage generator 5 rises very rapidly to a relatively high value. This direct control voltage serves to control both the amplifier 2, also termed adjusting member, in the useful signal path and the amplifier 8 operating as an adjusting member in the branch path. For this purpose the output of the control voltage generator 5 is connected to the control inputs 4 and 7 of the adjusting members 2 and 8. The two adjusting members or amplifiers 2 and 8 are so constructed that the slopes of their control characteristics (dependence of the amplification on the direct control voltage) are of the same sign.

The circuit described operates so that the alternating voltage that can be measured at the input 6 of the control voltage generator 5 is kept constant. If the two amplifiers 2 and 8 are similarly constructed the said manner of operation of the circuit described means that the full dynamic range of the useful signal at the input terminal 1 is reduced to zero in a signal path that includes the two amplifiers 2 and 8 connected in series. Hence the useful signal at the output of the amplifier 2 has half the dynamic range of the useful signal at the input terminal 1. The useful signal fed to the input terminal 1 is therefore compressed.

In FIG. 2 is illustrated a circuit for the expansion of a useful signal compressed e.g. by means of the circuit according to FIG. 1. Advantageously, in the circuit according to FIG. 2 the same components are in part used as in the circuit according to FIG. 1. Thus, the amplifier 8 and the control voltage generator 5 fed from this amplifier 8, in the branch path connected to the input of the useful signal path in the case of the circuit according to FIG. 2 are of the same construction as the amplifier 8 and the control voltage generator 5 in the circuit according to FIG. 1.

In the useful signal path of the circuit according to FIG. 2 there is arranged, between the input terminal 9 and the output terminal 12, an amplifier 10 of controllable amplification having a control input 11, the control characteristic of which is complementary to the control characteristic of the amplifier 8 in the branch path, i.e. has a slope of different sign.

The circuit according to FIG. 2 as so far described operates in such manner that the alternating voltage that can be measured at the input 6 of the control voltage generator 5 is kept to a constant value. Thereby the dynamic range of the useful signal on the input terminal 9 is reduced to zero in the branch path. Since the amplifier 10 in the useful signal path is controlled oppositely to the amplifier 8 in the branch path, the useful signal at the output terminal 12 has a greater dynamic range than the useful signal at the input terminal 9. If the two amplifiers 10 and 8 are—apart from the complementary control characteristics—similarly constructed the useful signal at the output terminal 12 has twice as large a dynamic range as the useful signal at the input terminal 9.

With a compression of a useful signal by means of the circuit according to FIG. 1 and a subsequent expansion by means of the circuit according to FIG. 2 the useful signal at the output terminal 12 has the same dynamic range as the useful signal fed to the input terminal 1 of the circuit according to FIG. 1. A full description of the circuit referred to is given in the mentioned U.S. Pat. No. 3,969,680.

In FIG. 3 is illustrated a practical example of a compression circuit of the invention. This circuit serves, like the circuit according to FIG. 1, for the compression of a useful signal fed to the input terminal 13, so that a useful signal of reduced dynamic range can be taken off at the output terminal 16. The useful signal path between the input terminal 13 and the output terminal 16 includes an amplifier 14 of controllable amplification having a control input 15. For the generation of a direct control voltage for the control of the amplifier 14 there is provided a branch path which includes two amplifiers 18 and 19 of controllable amplification connected in series and a control voltage generator 22 fed from the amplifier 19. The input of this branch path (input of the amplifier 18) is connected to the input of the useful signal path (input of the amplifier 14).

The control voltage generator 22 is constructed similarly to the control voltage generator 5 in the circuits according to FIG. 1 and FIG. 2. Its output voltage (direct control voltage) feeds the control inputs 15, 17 and 20 of the amplifiers 14, 18 and 19. The amplifiers 14, 18 and 19 are so constructed that their control characteristics have the same sign. The circuit described operates so that the alternating voltage that can be measured at the input 21 of the control voltage generator 22 is regulated to a constant value. Thereby the dynamic range of the useful signal at the input terminal 13 in the branch path is reduced to the value zero at the input 21 of the control voltage generator 22.

For the easily comprehensible case in which the amplifiers 14, 18 and 19 are the same, there can be taken off at the output of the amplifier 18 and hence at the output of the amplifier 14 controlled in the same manner as the amplifier 18 a useful signal path with a dynamic range which is exactly half as large as the dynamic range of the useful signal at the input terminal 13. The expanded useful signal is to be taken off at the output 26 of the useful signal path that includes a controllable amplifier 24 having a control input 25.

The circuit according to FIG. 4 includes, like the circuit according to FIG. 3, a branch path with amplifiers 18 and 19 and a control voltage generator 22, which in the simplest case is constructed similarly to the branch path in the circuit according to FIG. 3. The amplifier 24 in the useful signal path, the control input of which is fed from the control voltage generator 22, has a control characteristic the slope of which is of different sign from the slope of the control characteristics of the amplifiers 18 and 19. The said branch path is connected to the output (output of the amplifier 24) of the useful signal path.

For explaining the manner of operation of the expansion circuit according to FIG. 4 it will be assumed for the sake of simplicity that there is fed to the circuit according to FIG. 4 a signal which has been compressed by means of a circuit according to FIG. 3, the amplifiers in FIG. 3 and FIG. 4 being similarly constructed—apart from the complementary slopes of the control characteristics of the amplifiers 14 and 24. Then, starting from the input terminal 13 as far as the output terminal 26, there can be perceived a useful signal path which includes the two oppositely controlled amplifiers 14 and 24. The amplifying actions of the amplifiers 24 and 14 annul one another to some extent by reason of the similar branch paths, so that there can be taken off at the output terminal 26 a useful signal having a dynamic range which is just as large as that of the useful signal at the input terminal 13. The useful signal path of the circuit according to FIG. 4 varies the dynamic range of the useful signal fed to it by an amount which is dependent on the ratio of the number of controllable amplifiers located in the useful signal path to the number of controllable amplifiers located in the branch path.

The circuits described may be converted for the attainment of any desired degree of compression or expansion by varying the number of controllable amplifiers located in the useful signal path and in the branch path or their degree of amplification.

With the said oppositely directed control or regulation of the controllable amplifiers in the useful signal path and in the branch path it is crucial for the variation of amplification effective in the said signal paths to be of opposite sense. Thus in some cases, e.g. in the expansion circuit, identical amplifiers may be used in the useful signal path and in the branch path if care is taken to see that the said amplifiers have control voltages of opposite direction applied to them.

If in the compression circuit according to FIG. 3 means for limiting the overswing upon sudden large variations of the useful signal are to be used, these need only be provided in the amplifier located in the useful signal path. The said undesired overswing is then prevented in the useful signal path without the useful signals provided for generation of the direct control voltage being limited by this limitation.

What is claimed is:

1. A circuit for the automatic dynamic compression or expansion of an input signal, comprising
    input and output terminal;
    first controllable adjusting means coupled across said input and output terminals to form a useful signal path between said terminals;
    a branch path including second controllable adjusting means and a control generator connected to the output thereof, the output of said control generator being coupled to said first controllable adjusting means for varying the gain of said useful signal path and to said second controllable adjusting means for varying the gain of said branch path, the variation in the gain of said branch path being in a direction opposite to the direction of change in the magnitude of said input signal; wherein the improvement comprises
    means for coupling the input of said second controllable adjusting means to one of said input and output terminals, said input signal being compressed when the input of said second controllable adjusting means is connected to said input terminal and being expanded when the input of said second controllable adjusting means is connected to said output terminal.

2. A circuit according to claim 1 wherein said first controllable adjusting means located in said useful signal path includes means for limiting the useful signal in said path.

3. A circuit according to claim 1 wherein said first controllable adjusting means located in said useful signal path includes means for limiting the momentary increase of the useful signal in said path.

4. A circuit according to claim 1 wherein said first and second controllable adjusting means comprise variable gain amplifiers.

5. A circuit according to claim 4 wherein the input of the variable gain amplifier comprising said second controllable adjusting means is coupled to said input terminal and wherein all of said variable gain amplifiers have control characteristics with slopes of the same sign.

6. A circuit according to claim 4 wherein the input of the variable gain amplifier comprising said second controllable adjusting means is coupled to said output terminal and wherein the variable gain amplifier comprising said first controllable adjusting means has a control characteristic with a slope of the opposite sign from that of the variable gain amplifier comprising said second controllable adjusting means.

7. A circuit according to claims 5 or 6 wherein the variable gain amplifier comprising said second controllable adjusting means is provided with two stages, the gain of both of said stages being controlled by the output of said control generator.

* * * * *